(12) United States Patent
Ohshima

(10) Patent No.: US 9,330,787 B2
(45) Date of Patent: May 3, 2016

(54) MEMORY SYSTEM AND MEMORY CONTROLLER

(71) Applicant: Kabushiki Kaisha Toshiba, Minato-ku (JP)

(72) Inventor: Gen Ohshima, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 107 days.

(21) Appl. No.: 14/023,890

(22) Filed: Sep. 11, 2013

(65) Prior Publication Data

US 2014/0281769 A1 Sep. 18, 2014

Related U.S. Application Data

(60) Provisional application No. 61/802,832, filed on Mar. 18, 2013.

(51) Int. Cl.
*G11C 29/42* (2006.01)
*G11C 16/34* (2006.01)
(Continued)

(52) U.S. Cl.
CPC ............ *G11C 29/42* (2013.01); *G06F 3/0619* (2013.01); *G06F 11/1068* (2013.01); *G06F 11/1412* (2013.01); *G06F 12/02* (2013.01); *G06F 2212/7211* (2013.01); *G11C 16/0483* (2013.01); *G11C 16/34* (2013.01); *G11C 16/3418* (2013.01); *G11C 16/3431* (2013.01); (Continued)

(58) Field of Classification Search
CPC ................. G11C 29/028; G11C 29/42; G11C 2029/0411; G11C 16/3431; G11C 16/3418; G11C 16/0483; G11C 16/34; G06F 11/1068; G06F 12/02; G06F 11/1412; G06F 2212/7204; G06F 2212/7211; G06F 3/0619
USPC ........ 365/185.22, 185.24; 711/703; 714/47.1, 714/47.2, 704, 721, 764
See application file for complete search history.

(56) References Cited

U.S. PATENT DOCUMENTS 5,844,841 A 12/1998 Takeuchi et al.
6,744,670 B2 6/2004 Tamada et al.
(Continued)

FOREIGN PATENT DOCUMENTS

JP 2001-23384 1/2001
JP 2001-357683 12/2001
(Continued)

*Primary Examiner* — April Y Blair
*Assistant Examiner* — Sazzad Hossain
(74) *Attorney, Agent, or Firm* — Oblon, McClelland, Maier & Neustadt, L.L.P.

(57) ABSTRACT

According to one embodiment, a memory system includes a non-volatile memory and a memory controller that controls the non-volatile memory. The non-volatile memory includes a memory cell array and an access control unit. The access control unit performs a program operation for changing threshold voltages of memory cells and a read operation for reading data from the memory cells. The memory controller includes a read/write control unit having a first program parameter set and a second program parameter set. The read/write control unit causes the access control unit to perform a program operation based on the first program parameter set, and when a predetermined condition is satisfied, performs switching from the first program parameter set to the second program parameter set and causes the access control unit to perform a program operation based on the second program parameter set.

11 Claims, 12 Drawing Sheets

(51) Int. Cl.

| | |
|---|---|
| *G11C 29/28* | (2006.01) |
| *G06F 3/06* | (2006.01) |
| *G06F 11/14* | (2006.01) |
| *G06F 11/10* | (2006.01) |
| *G06F 12/02* | (2006.01) |
| *G11C 16/04* | (2006.01) |
| *G11C 29/04* | (2006.01) |

(52) U.S. Cl.
CPC ........ *G11C29/28* (2013.01); *G11C 2029/0409* (2013.01); *G11C 2029/0411* (2013.01)

(56) References Cited

U.S. PATENT DOCUMENTS

| | | | | |
|---|---|---|---|---|
| 8,060,797 B2* | 11/2011 | Hida | ................... | G06F 11/1068 365/185.01 |
| 8,446,777 B2* | 5/2013 | Ueno | ..................... | G11C 16/14 365/185.19 |
| 8,566,671 B1* | 10/2013 | Ye | ....................... | G06F 11/1048 714/764 |
| 2008/0158990 A1* | 7/2008 | Wan | ................... | G11C 11/5628 365/185.22 |
| 2012/0069681 A1* | 3/2012 | Oikawa | ............. | G11C 11/5628 365/185.24 |
| 2012/0239858 A1* | 9/2012 | Melik-Martirosian | | G06F 11/076 711/103 |
| 2013/0132652 A1* | 5/2013 | Wood | ................. | G06F 12/0246 711/103 |

FOREIGN PATENT DOCUMENTS

| | | |
|---|---|---|
| JP | 2003-242787 | 8/2003 |
| JP | 4902002 | 1/2012 |
| JP | 2012-69199 | 4/2012 |

\* cited by examiner

MEMORY SYSTEM AND MEMORY CONTROLLER

CROSS-REFERENCE TO RELATED APPLICATIONS

This application is based upon and claims the benefit of priority from U.S. Provisional Patent Application No. 61/802,832, filed on Mar. 18, 2013; the entire contents of which are incorporated herein by reference.

FIELD

Embodiments described herein relate generally to a memory system and a memory controller.

BACKGROUND

As one of memory systems, there is a NAND flash memory including a NAND type memory cell. In the NAND flash memory, since electrons are caused to forcibly pass through a tunnel oxide film at the time of erasing or at the time of programming, the tunnel oxide film gradually deteriorates. Further, due to a tunnel effect or hopping, electrons leak through a floating gate. In addition, accumulated electrons trapped in the tunnel oxide film tend to be discharged over time. These phenomena cause a problem of expanding the distributions of erase potential and write potential and lowering a proof stress against retention.

DETAILED DESCRIPTION

In general, according to an embodiment of the present invention, a memory system includes a non-volatile memory and a memory controller that controls the non-volatile memory. The non-volatile memory includes a memory cell array and an access control unit. The memory cell array includes a plurality of memory cells which are configured to be settable with a plurality of different threshold voltages and to store data corresponding to the threshold voltages set thereto. The access control unit performs a program operation for changing the threshold voltages of the memory cells and a read operation for reading data from the memory cells. The memory controller includes a read/write control unit. The read/write control unit has a first program parameter set and a second program parameter set. A difference between a maximum value and a minimum value of a threshold voltage set to the memory cells by a program operation based on the second program parameter set is larger than a difference between a maximum value and a minimum value of a threshold voltage set to the memory cells by a program operation based on the first program parameter set. The read/write control unit causes the access control unit to perform a program operation based on the first program parameter set when the memory system starts to be used. When a predetermined condition is satisfied, the read/write control unit performs switching from the first program parameter set to the second program parameter set and causes the access control unit to perform a program operation based on the second program parameter set.

Exemplary embodiments of a memory system and a memory controller will be explained below in detail with reference to the accompanying drawings. The present invention is not limited to the following embodiments. The present invention is not limited to the following embodiments. Here, the description will proceed with an example in which a semiconductor memory device according to an embodiment of the present invention is applied to a solid state drive (SSD) including a NAND flash memory, but a semiconductor memory device to which an embodiment of the present invention is applied is not limited to an SSD.

(First Embodiment)

Figure 1:
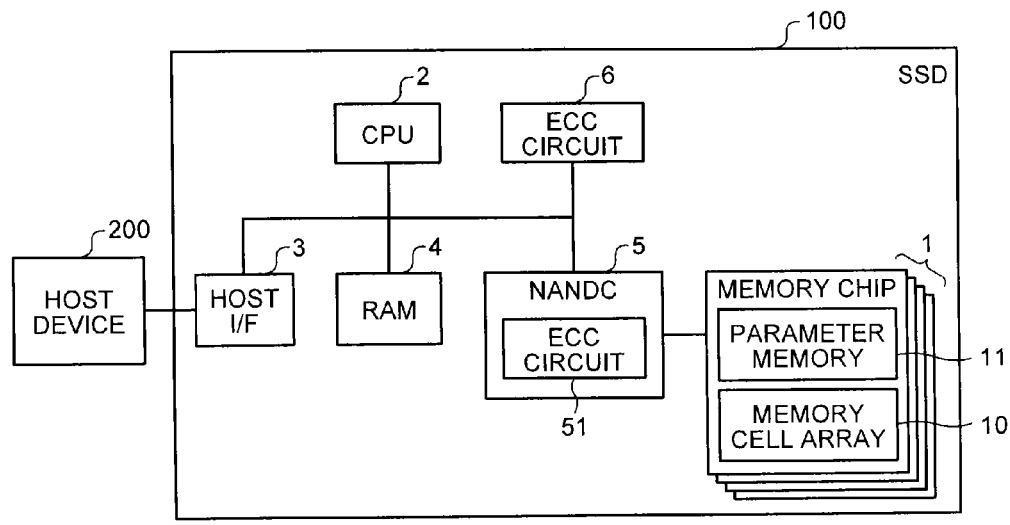
FIG. 1 is a diagram illustrating a configuration example of an SSD according to a first embodiment.

FIG. 1 is a diagram illustrating a configuration example of an SSD according to a first embodiment. As illustrated in FIG. 1, an SSD 100 is connected with a host device 200 such as a personal computer through a predetermined communication interface, and functions as an external memory device of the host device 200. A read request or a write request that the SSD 100 receives from the host device 200 includes an initial address of an access target defined by logical block addressing (LBA) and a sector size representing a range of a region of an access target. The communication interface is not limited to an SATA standard, and various communication interface standards such as serial attached SCSI (SAS) and PCI express (PCIe) may be employed.

The SSD 100 includes a plurality of (here, four) memory chips (chips) 1, a central processing unit (CPU) 2, a host interface (host I/F) 3, a random access memory (RAM) 4, a NAND controller (NANDC) 5, and an error checking and correcting (ECC) circuit 6. The CPU 2, the host I/F 3, the RAM 4, the NANDC 5, and the ECC circuit 6 are connected to one another via a bus. The memory chip 1 is connected to the NANDC 5.

The CPU 2, the host I/F 3, the NANDC 5, and the ECC circuit 6 configures a memory controller according to an embodiment of the present invention. The memory controller may be configured to include the RAM 4. The memory controller may control data transfer between the host device 200 and the chip 1. In other words, the memory controller controls the chip 1.

The RAM 4 is a volatile memory that stores control information of the SSD 100 or temporarily stores transfer data between the host device 200 and the memory chip 1. The host I/F 3 executes control of a communication interface with the host device 200 and data transfer between the host device 200 and the RAM 4. The CPU 2 controls the entire SSD 100 based on a firmware.

The NANDC 5 executes data transfer between the memory chip 1 and the RAM 4. Further, the NANDC 5 includes an ECC circuit 51 that corrects an error generated when the memory chip 1 is accessed. The ECC circuit 51 encodes or decodes a first error correcting code and a second error correcting code.

The ECC circuit 6 decodes the second error correcting code. Examples of the first error correcting code and the second error correcting code include a humming code, a Bose Chaudhuri Hocqenghem (BCH) code, a Reed Solomon (RS) code, and a low density parity check (LDPC) code, and the correction capability of the second error correcting code is assumed to be higher than the correction capability of the first error correcting code. When data read from the chip 1 has an error that is uncorrectable by the ECC circuit 51, the read data is transferred to the ECC circuit 6 and then subjected to error correction by the ECC circuit 6.

The memory chip 1 includes a memory cell array 10 that stores write data from the host device 200 and a parameter memory 11 that stores various kinds of parameters.

Figure 2:
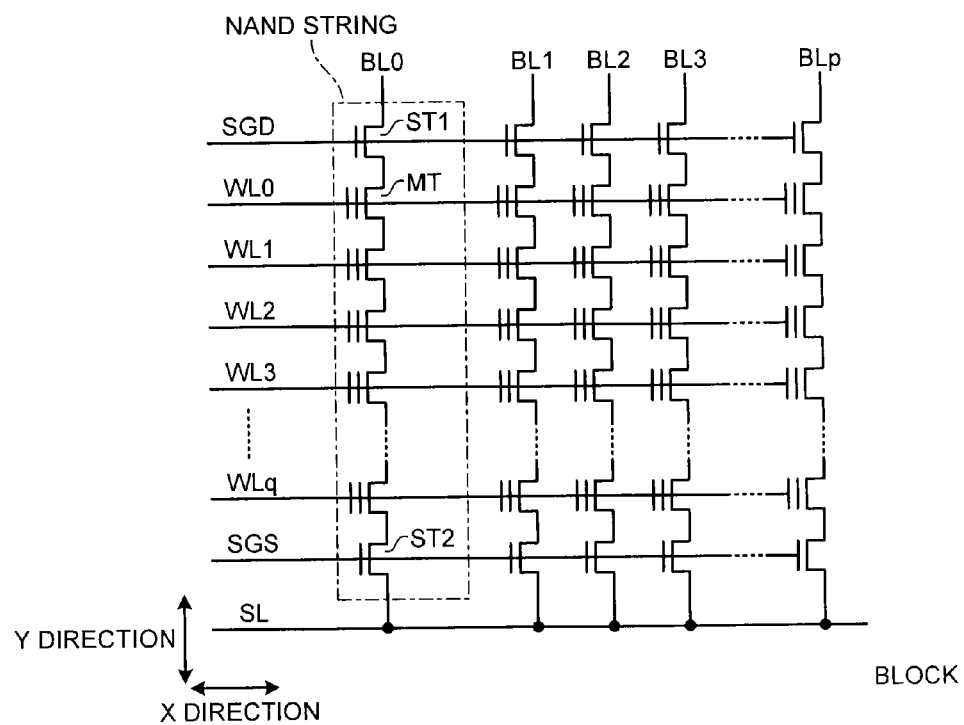
FIG. 2 is a circuit diagram illustrating a configuration example of a block included in a memory cell array.

The memory cell array 10 is configured to include a plurality of blocks serving as erase units. FIG. 2 is a circuit diagram illustrating a configuration example of a block included the memory cell array 10. As illustrated in FIG. 2, each block includes (m+1) NAND strings that are sequentially arranged in an X direction (m is an integer of 0 or more). In selecting transistors ST1 included in the (m+1) NAND strings, drains are connected to bit lines BL0 to BLp, respectively, and gates are commonly connected to a selecting gate line SGD. Further, in selecting transistors ST2, sources are commonly connected to a source line SL, and gates are commonly connected to a selecting gate line SGS.

Each memory cell transistor MT is configured with a metal oxide semiconductor field effect transistor (MOSFET) having a stacked gate structure formed on a semiconductor substrate. The stacked gate structure includes a charge accumulating layer (floating gate) formed over a semiconductor substrate with a tunnel oxide film interposed therebetween and a control gate electrode formed over the charge accumulating layer with an inter-gate insulating film interposed therebetween. In the memory cell transistor MT, a threshold voltage changes according to the number of electrons accumulated in the floating gate, and data is stored according to a difference in the threshold voltage.

In other words, the memory cell transistor MT causes electrons to be charged through a peripheral circuit (not illustrated) disposed in the chip 1 so that the threshold voltage reaches a target value corresponding to data. The peripheral circuit includes a charge pump, a row decoder, a sense amplifier, and a column decoder. The memory cell transistor MT may be configured to store 1 bit or may be configured to store multiple values (data of 2 bits or more).

In each NAND string, the (n+1) memory cell transistors MT are arranged between the source of the selecting transistor ST1 and the drain of the selecting transistor ST2 so that respective current paths are connected to each other in series. Further, control gate electrodes are connected to word lines WL0 to WLq, respectively, in order from the memory cell transistor MT positioned to be closest to the drain side. Thus, the drain of the memory cell transistor MT connected to the word line WL0 is connected to the source of the selecting transistor ST1, and the source of the memory cell transistor MT connected to the word line WLq is connected to the drain of the selecting transistor ST2.

The word lines WL0 to WLq are commonly connected to the control gate electrodes of the memory cell transistors MT between the NAND strings in the block. In other words, the control gate electrodes of the memory cell transistors MT in the same row in the block are connected to the same word line WL. The (m+1) memory cell transistors MT connected to the same word line WL are dealt as a page, and data programming and data reading are performed in units of pages.

Further, the bit lines BL0 to BLp are commonly connected to the drains of the selecting transistors ST1 between blocks. In other words, the NAND strings in the same row in a plurality of blocks are connected to the same bit line BL.

Figure 3:
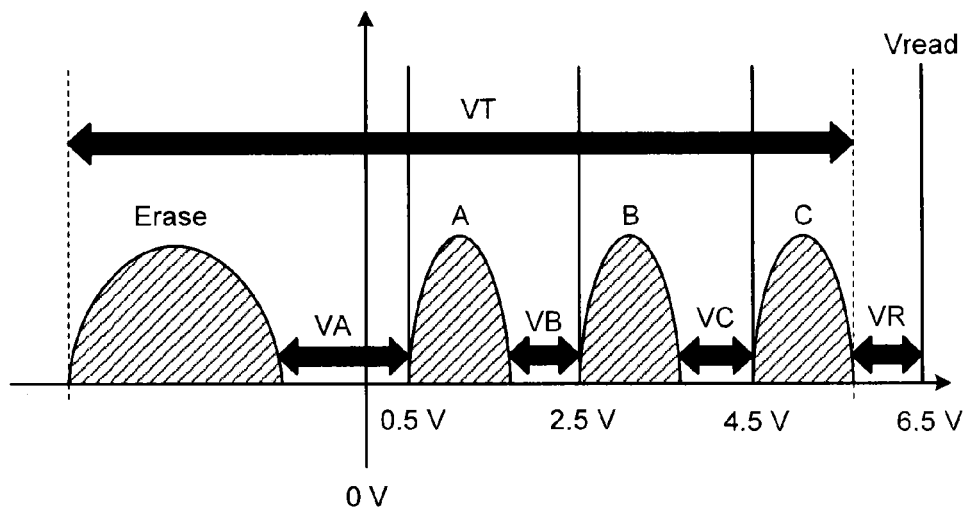
FIG. 3 is a diagram illustrating an example of the distribution of a threshold voltage of a general cell.

FIG. 3 illustrates an example of the distribution of a threshold voltage of a cell in a four-value data storage scheme of storing 2 bits in a single memory cell transistor MT (cell). According to the four-value data storage scheme, the threshold voltage forms a potential distribution that varies according to a value (erase, A, B, or C) of data. Electrons are charged in a cell so that the threshold voltage reaches a target value, but there is a variation in the threshold voltage after charging. A margin having an interval such as VA, VB, and VC exists between the potential distributions. Further, voltage values illustrated in FIG. 3 are reference values added in order to make clear a difference with subsequent drawings.

VR represents a margin on a voltage Vread (Vpass) applied to CG of another word line WL when a cell value of a certain word line WL is read. VR is necessary as a margin when a NAND string is blocked due to excessive writing. Vt represents a difference between a maximum value and a minimum value of potential that can be obtained by a cell in a potential distribution design.

Figure 4:
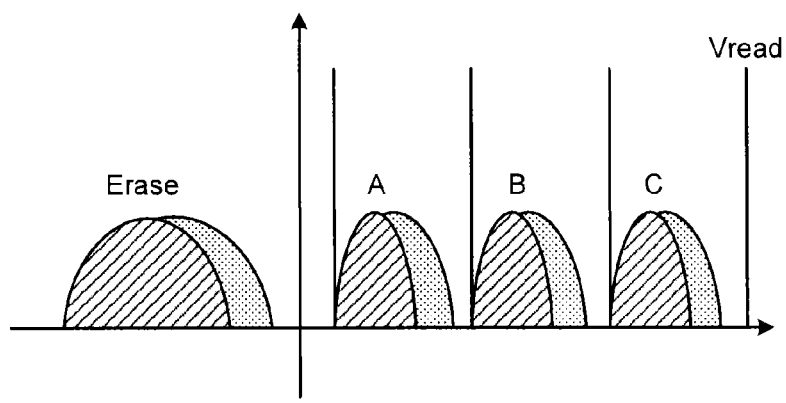
FIG. 4 is a diagram illustrating an example of the distribution of a threshold voltage directly after writing is performed at a threshold voltage of a general cell.

FIG. 4 illustrates an example of the potential distribution directly after writing in the state in which deterioration of a tunnel oxide film (hereinafter, referred to simply as a film or an oxide film) has progressed. As can be seen from FIG. 4, in all potential distributions, the potential distribution expands upward due to a program disturb. Since a deterioration degree of a film differs according to a cell, the number of trapped electrons accumulated in a film of each cell differs. As a result, a time to write each cell to a certain potential becomes faster as the number of trapped electrons increases, a cell that has finished writing fast is continuously under influence of a write pulse for a slow cell, and thus the program disturb has stronger influence.

Figure 5:
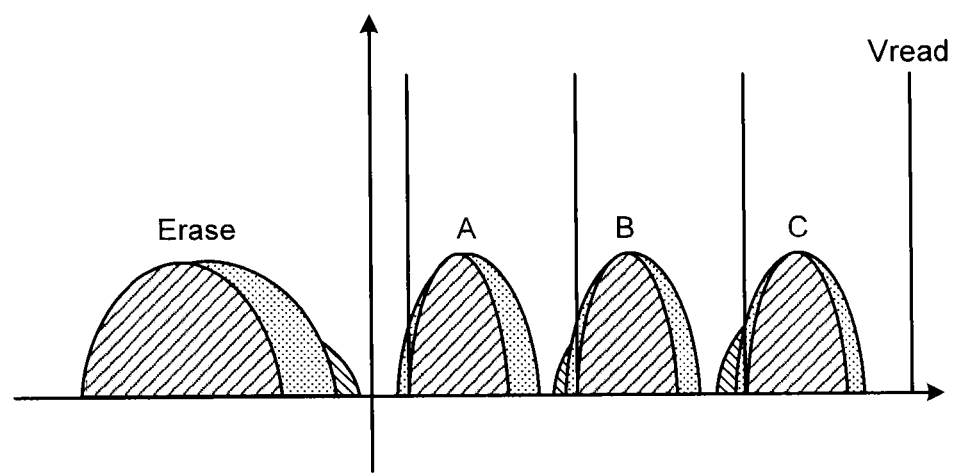
FIG. 5 is a diagram illustrating an example of the distribution of a threshold voltage when a predetermined time elapses after writing in the state in which deterioration of a film has progressed.

FIG. 5 illustrates an example of the distribution of a threshold voltage when a predetermined time elapses after writing in the state in which deterioration of a tunnel oxide film has progressed. As electrons trapped on a surface layer of a film leave, influence of the program disturb gets weakened. Further, due to a tunnel leak caused by deterioration of a film, potential drop appears in some cells.

Figure 6:
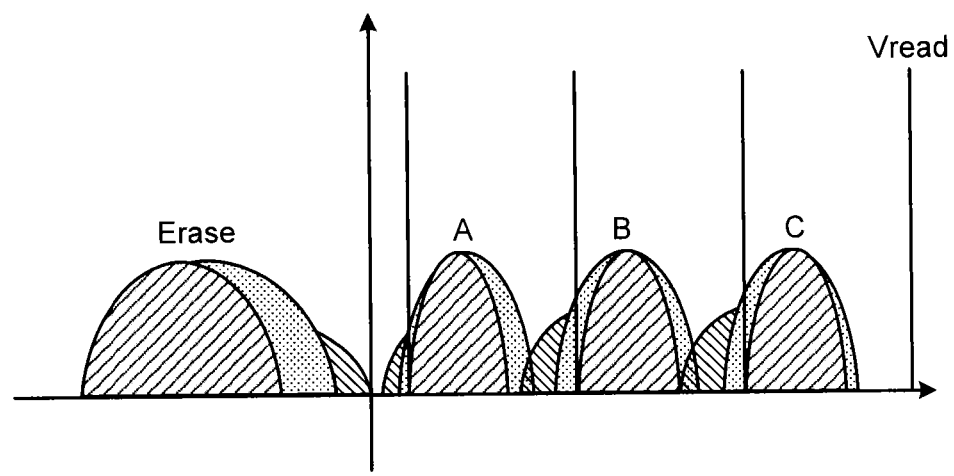
FIG. 6 illustrates an example of the distribution of a threshold voltage when a predetermined time elapses after the state of FIG. 5.

When deterioration of a film further progresses, a portion in which potential distributions overlap each other appears as illustrated in FIG. 6. In the overlap portion, it is difficult to take out an error even when a threshold value is changed at the time of reading, and an error is restored by exertion of a correction capability of an ECC (the ECC circuit 51 and the ECC circuit 6). When deterioration of a film further progresses, the amount of the overlap portion between the potential distributions exceeds the correction capability of the ECC, and thus an uncorrectable error occurs.

A value of Vt is mostly in proportion to a worst average of an electric filed stress actually applied to an oxide film. By designing Vt narrowly, the progress of deterioration of an oxide film can be slowed, but when Vt is narrow, the margin between the potential distributions also decreases. By designing the distribution width of each potential distribution narrowly, the margin between the potential distributions can be relatively increased, but in order to narrow the distribution width of the potential distribution, it is necessary to reduce a step voltage $\Delta V$ at the time of writing. As a result, the number of write pulses increases, and the write speed (performance) is lowered. As described above, the potential distribution is designed by employing an optimal solution obtained by considering a margin on various disturbs, a write performance, and tolerance of a tunnel oxide film at the same time.

According to a technique (comparative example) to be compared with the present embodiment, the potential distribution is fixed. The potential distribution is designed so that a predetermined error rate and a predetermined retention capacity are maintained, in the worst case, that is, even when the number of cycles (rewriting) including erasing and programming (the number of rewriting times) reaches a predetermined value. Thus, according to the comparative example, in the state in which deterioration does not progress, the margin between the potential distributions is sufficiently secured, and thus the ECC hardly exerts the correction capability.

In this regard, according to an embodiment of the present invention, when deterioration of a film does not progress, the SSD 100 is operated in a state in which Vt becomes narrow while exerting the correction capability of the ECC, and Vt increases when deterioration of a film progresses. More specifically, when deterioration of a film does not progress, the SSD 100 operates in a state in which an interval of a target value of a threshold voltage between different pieces of data is decreased, and changes the target value so that the interval of the threshold voltage increases as deterioration of a memory cell progresses. Thus, according to an embodiment of the present invention, in the state in which deterioration of a film does not progress, an operation can be performed in the state in which Vt becomes narrower than that in the comparative example. As a result, according to an embodiment of the present invention, compared to the comparative example, damage to an oxide film at the time of charging or discharging is reduced, and the number of rewritable times increases by a degree by which damage is reduced. In addition, according to the first embodiment, Vt increases at a timing when a load of the ECC reaches a predetermined level.

Figure 7:
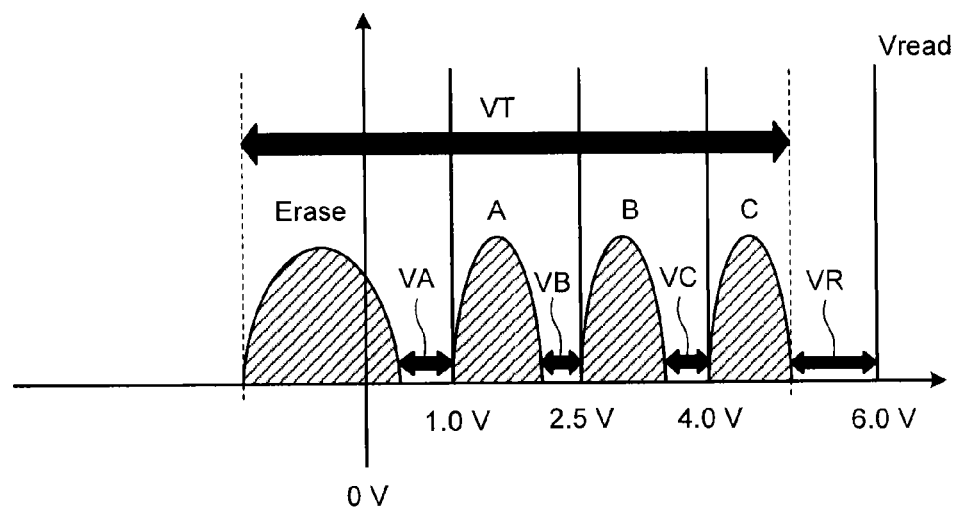
FIG. 7 is a diagram illustrating an example of the distribution of a threshold voltage of a cell when Vt becomes narrow according to the present invention.

FIG. 7 illustrates an example of the distribution of a threshold voltage when Vt becomes narrow. When Vt is narrow, damage to an oxide film can be reduced by single rewriting. When the target value of the threshold voltage is changed so that the write performance does not change, potential to be shifted is also inevitably reduced by a single write pulse at a rate (at which the step voltage $\Delta V$ decreases) at which the potential distribution Vt is designed to be narrow, and the distribution width between the potential distributions also becomes narrow.

Figure 8:
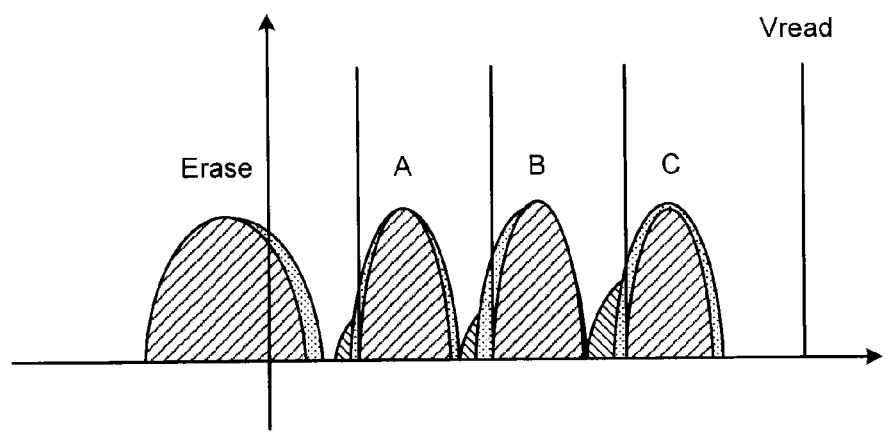
FIG. 8 is a diagram illustrating various kinds of disturbs when an operation is performed in the state of the potential distribution illustrated in FIG. 7.

FIG. 8 is a diagram illustrating various kinds of disturbs when an operation is performed in the state of the potential distribution illustrated in FIG. 7. As can be seen from FIG. 7, the margins allowed on various kinds of disturbs are narrower than those in the state (that is, the state illustrated in FIG. 3) before Vt becomes narrow. However, since deterioration of a film does not progress, influence of the disturb is small. According to an embodiment, even when an error occurs as the margins on various kinds of disturbs become narrow, rewriting can be repeated with narrow Vt in which damage to an oxide film is small during a period of time in which an error can be corrected by exertion of the correction capability of the ECC. In other words, even when the potential distributions slightly overlap each other, a setting of the target value causing Vt to be narrow is used until an error occurrence rate (error rate) reaches a predetermined error rate (for example, until it becomes difficult to correct through a weak ECC (the ECC circuit 51) at a first stage. In other words, the capability of the ECC can be used as much as possible even in the state in which deterioration of a film does not progress. Thus, even when a narrow interval margin between the potential distributions is used up, rewriting can be repeated in the state in which Vt becomes narrow within the correction capability of the ECC.

For example, parameters used to set the distribution of the threshold voltage are as follows. In other words, examples of parameters (read parameter) for a read operation include a read threshold voltage and a Vpass voltage. Further, when an MLC type memory cell array is applied, a threshold value used to read midpoint potential used in the process of writing to final potential is also included as the read parameter. Examples of parameters (write parameter) for a write operation include a word line voltage, a write pulse width, a step voltage $\Delta V$, a maximum of the number of pulses, a verify voltage (a target value of a threshold voltage) used to determine whether or not a threshold value of a cell has reached a target value, and a verify determination standard. As described above, generally, the write parameters are larger in the number of items to be set than the read parameters, and thus when a setting change is frequency performed, the performance is likely to deteriorate.

Hereinafter, parameters of three sets that differ in Vt are assumed to be prepared. In other words, the CPU 2 sets one of the parameters of the three sets to the parameter memory 11. The memory chip 1 uses a setting value stored in the parameter memory 11 when accessing the memory cell array 10.

Here, in the write parameter and the read parameter, parameters respectively belonging to different parameter sets are assumed to be individually set to the parameter memory 11. When the write parameter is changed in units smaller than the chip 1, the write parameter need to be set to the parameter memory 11 according to a program destination each time, and thus the write performance deteriorates due to a frequent setting change. In this regard, here, as an example, the write parameter is assumed to be changed in units of chips, and when the write parameter is set to the parameter memory 11, the write parameter set to the parameter memory 11 is assumed not to change until a next timing to narrow Vt.

Here, the write parameter corresponds to the read parameter in a one-to-one manner. When the read parameter (that is, the read parameter belonging to the same parameter set) corresponding to the write parameter used for programming is used, reading does not succeed. The erasing is executed using the write parameter. Thus, when the write parameter is set not to be changed until a timing to narrow Vt, there occurs a state in which a block erased or programmed using a non-changed write parameter and a block erased or programmed using a changed write parameter are present together on one chip 1. Hereinafter, this state may be referred to as a "middle-of-Vt-change." When reading is performed on the chip 1 in the middle-of-Vt-change state, setting content of the read memory in the parameter memory 11 is assumed to be updated according to the write parameter applied to programming of a block of a read destination. Since the read parameters are smaller in the number of setting items than the write parameters and thus smaller in the total size than the write parameters, even when the read parameter is set to the parameter memory 11 according to a read destination, influence on the read performance is smaller than when the write parameter is set according to a program destination.

Figure 9:
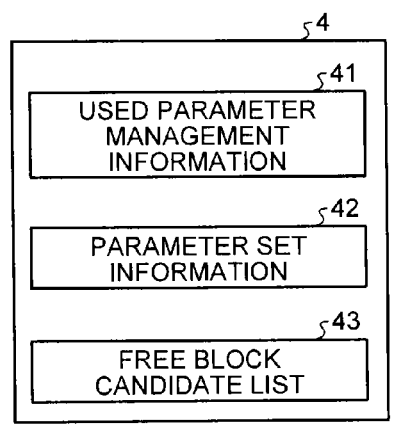
FIG. 9 is a diagram illustrating a memory configuration of a RAM.

FIG. 9 is a diagram illustrating a memory configuration of the RAM 4. As illustrated in FIG. 9, the RAM 4 stores used parameter management information 41, parameter set information 42, and a free block candidate list 43.

Figure 10:
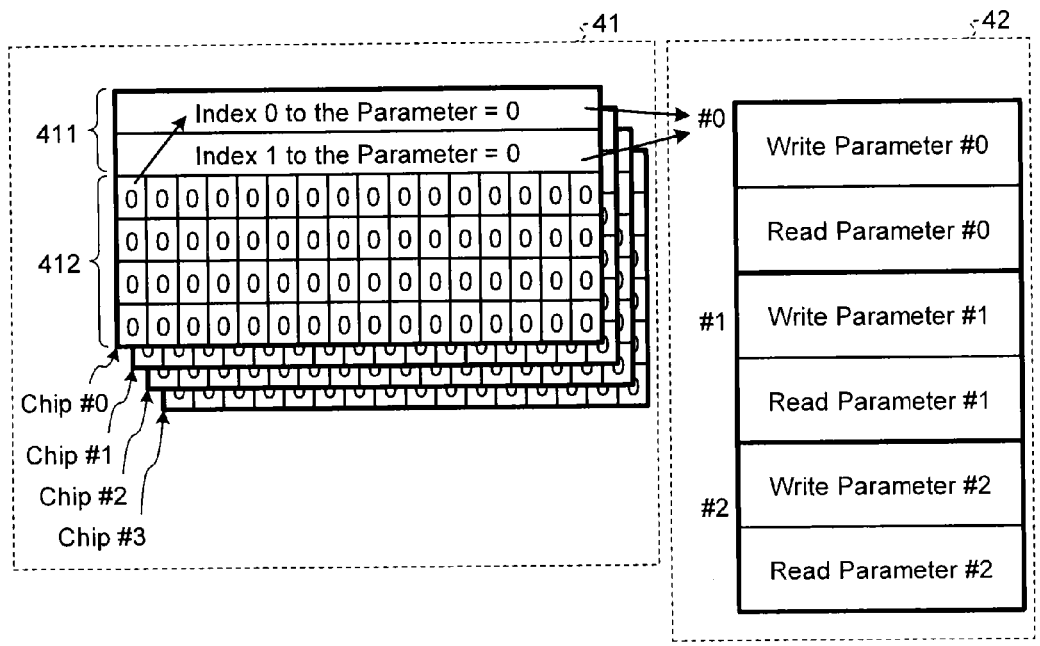
FIG. 10 is a diagram illustrating a data structure example of used parameter management information and parameter set information.

FIG. 10 is a diagram illustrating a data structure example of the used parameter management information 41 and the parameter set information 42.

The parameter set information 42 is information in which a parameter set that differs according to each Vt is described. The three parameter sets described in the parameter set information 42 are specified by parameter set identifiers, respectively. Here, the three parameter sets described in the parameter set information 42 are assumed to be given identifiers of #0, #1, and #2, respectively, in order from one in which Vt is narrow.

The used parameter management information 41 is information used to manage information specifying a parameter set for programming for each chip and to manage information specifying a parameter set used for programming for each block. Here, the used parameter management information 41 is assumed to be divided and managed in units of chips.

The used parameter management information 41 includes index information 411 and block information 412. The index information 411 is information used to associate each of an index 0 and an index 1 with a parameter set identifier. The block information 412 represents whether or not programming has been performed for each block using a parameter set associated with either the index 0 or the index 1.

Here, changing of the write parameter is executed in units of chips. However, changing of the read parameter in units of chips is completed when erasing is completed on all blocks belonging to the chip 1 of which write parameter is changed. In the state in which a changing of the read parameter in units of chips is completed, both the index 0 and the index 1 remain associated with the same parameter set identifier. Then, the pieces of the block information 412 on all blocks are unified to "0" or "1." This state is referred to as a "Vt change completion state." In the middle-of-Vt-change state, the parameter set identifier representing the changed write parameter is associated with the index 1, and the parameter set identifier representing the non-changed write parameter is associated with the index 0. Further, "0" representing the index 0 is stored in the block information 412 on a block lastly erased using the non-changed write parameter, and "1" representing the index 1 is stored in the block information 412 on a block lastly erased using the changed write parameter.

Here, through wear leveling, control of erasing and programming is assumed to be performed so that an impoverishment degree of a film becomes substantially even in the whole block range. Ideally, deterioration degree of a film becomes substantially even in the whole block range.

The free block candidate list 43 is a list in which information designating a block of an erase target is recorded. A block recorded in the free block candidate list 43 is erased by a compaction unit 23 which will be described later, and then dealt as a free block. The free block refers to an empty block that is not allocated an LBA.

Figure 11:
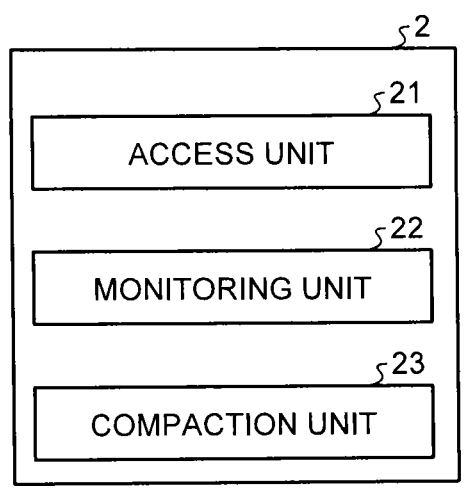
FIG. 11 is a diagram illustrating a function of a CPU.

FIG. 11 is a diagram illustrating a function of the CPU 2. The CPU 2 includes an access unit 21, a monitoring unit 22, and the compaction unit 23 as firmware is executed.

The access unit 21 controls data transfer between the host device 200 and the memory chip 1 performed through the RAM 4. As a part of control of data transfer, the access unit 21 executes reading access or programming access to the memory chip 1. The access unit 21 specifies a block of a read destination or a program destination with reference to a translation table (not illustrated) in which a correspondence relation between an LBA and a physical address of the memory cell array 10 is described. When reading is executed, the access unit 21 specifies a parameter set of a read parameter to be used for a block of a read destination with reference to the used parameter management information 41. Then, when a read parameter included in the same parameter set as the specified parameter set is not set to the parameter memory 11, the access unit 21 sets a read parameter included in the specified parameter set before the reading is executed to the parameter memory 11.

The monitoring unit 22 monitors an error occurrence probability for each chip, and specifies the chip 1 of a parameter set change target based on the monitoring result.

When deterioration of an oxide film progresses, there occurs an error that is uncorrectable even by an ECC (the ECC circuit 6) at a second stage. The monitoring unit 22 specifies the chip 1 in which the uncorrectable error is likely to occur, and decides the specified chip 1 as a parameter set change target. An occurrence probability (uncorrectable bit error rate; UBER) of an error that is uncorrectable even by the ECC (the ECC circuit 6) of the second stage has a probabilistically proportional relation with an occurrence probability (bit error rate; BER) of an error corrected by the ECC (the ECC circuit 6) at the second stage and an BER by the ECC (the ECC circuit 51) at the first stage. In other words, by suppressing the BER by the ECC circuit 51 to be equal to or less than a predetermined threshold value corresponding to a threshold value for the UBER, it is possible to cause the UBER not to exceed a predetermined threshold value. For example, the monitoring unit 22 monitors the BER by the ECC circuit 51 for each chip, and when the chip 1 in which the BER exceeds a threshold value previously decided according to the UBER is detected, the monitoring unit 22 decides the corresponding chip 1 as the parameter set change target. The value used for the determination by the monitoring unit 22 is not limited to the BER by the ECC circuit 51. For example, the BER by the ECC circuit 6 may be used.

The compaction unit 23 executes a compaction. When there is a single chip 1 in the middle-of-Vt-change state, the compaction unit 23 decides a block programmed using the non-changed write parameter among blocks included in the chip 1 in the middle-of-Vt-change as a compaction target. Specifically, the compaction unit 23 reads valid data stored in a block programmed using a non-changed old write parameter, programs the corresponding block to another block, and then erases the corresponding block using a new write parameter. In other words, the compaction unit 23 changes the read parameter in units of chips by sequentially erasing blocks belonging to the chip 1 decided as the parameter set change target by the monitoring unit 22. Similarly to the access unit 21, the compaction unit 23 specifies the write parameter used for the block of the read destination, and when the read parameter corresponding to the specified write parameter does not remain set to the parameter memory 11, the compaction unit 23 sets the corresponding read parameter to the memory 11 before executing reading.

Figure 12:
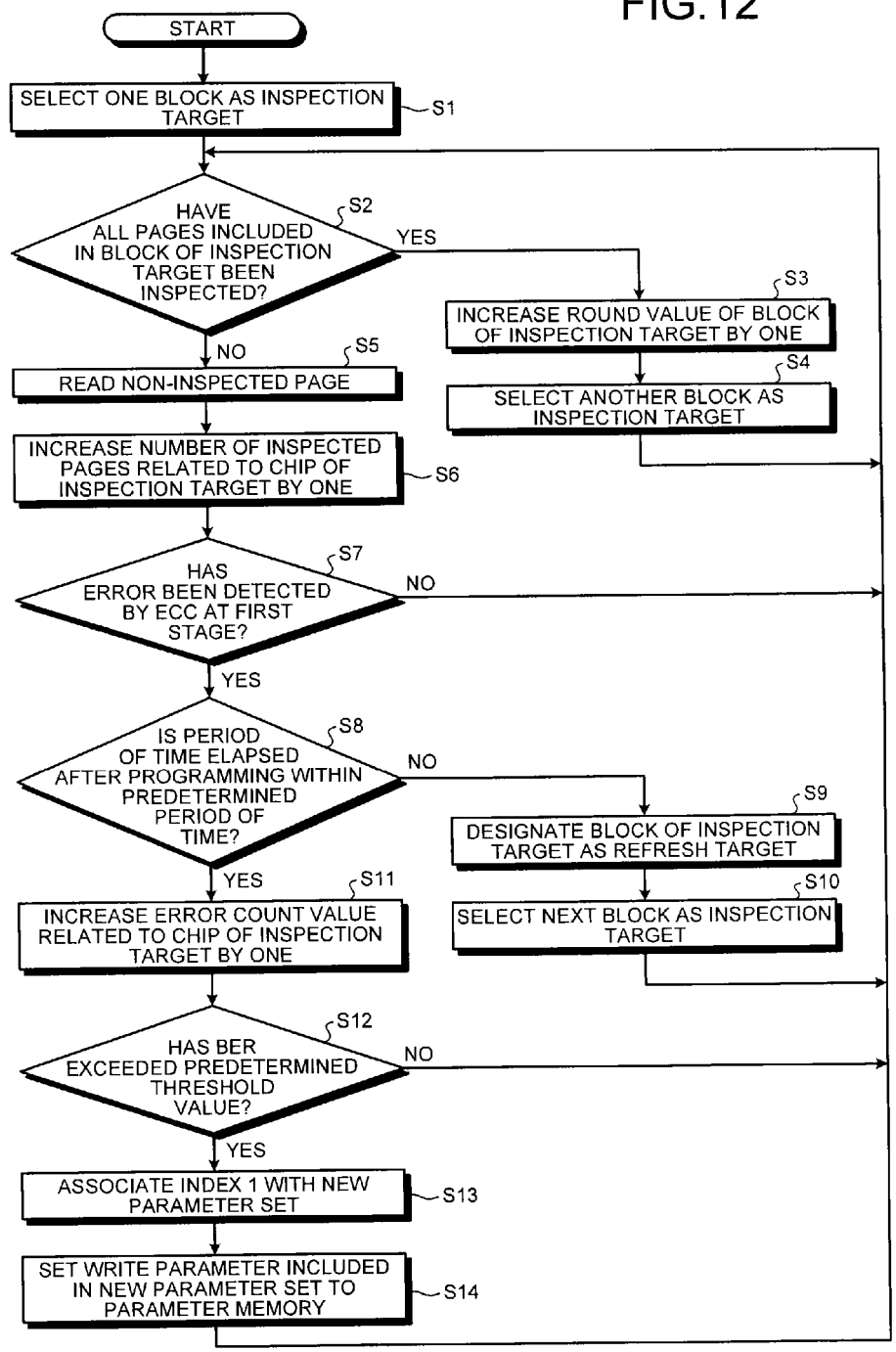
FIG. 12 is a flowchart for describing an operation of a monitoring unit.

FIG. 12 is a flowchart for describing an operation of the monitoring unit 22. Here, the monitoring unit 22 stores a round value for each block, and stores the number of inspected pages and an error count value for each chip. The round value is assumed to be reset to zero when erasing is performed.

First of all, the monitoring unit 22 selects one block as an inspection target (S1). Then, the monitoring unit 22 determines whether or not all pages included in the block of the inspection target have been inspected (S2). When it is determined that all pages included in the block of the inspection target have been inspected (Yes in S2), the monitoring unit 22 increases a round value of the block by one (S3). Then, the monitoring unit 22 selects another block as the inspection target (S4), and executes the process of step S2 again.

When it is determined that there is a non-inspected page (No in S2), the monitoring unit 22 selects one of the non-inspected page, and reads the selected page (S5). Then, the monitoring unit 22 increases the number of inspected pages for the chip 1 to which the block of the inspection target belongs by one (S6).

Subsequently to the process of step S6, the monitoring unit 22 determines whether or not an error has been detected by the ECC (the ECC circuit 51) at the first stage (S7). When it is determined that an error has not been detected (No in S7), the monitoring unit 22 executes the process of step S2 again.

When it is determined that an error has been detected (Yes in S7), the monitoring unit 22 determines whether or not a period of time that has elapsed after programming the page read by the process of step S5 is within a predetermined period of time (S8). Here, whether or not the period of time that has elapsed after programming is within the predetermined period of time may be determined, for example, based on that the monitoring unit 22 determines whether or not the round value of the block of the inspection target is equal to or less than a predetermined threshold value. When the period of time that has elapsed after programming has exceeded the predetermined period of time (No in S8), the monitoring unit 22 designates the block of the inspection target as a refresh target (S9). Then, the monitoring unit 22 selects a next block as the inspection target (S10), and executes the process of step S2 again.

When it is determined that the period of time that has elapsed after programming is within the predetermined period of time (Yes in S8), the monitoring unit 22 increases an error count value of the chip 1 to which the block of the inspection target belongs (hereinafter, the chip 1 of the inspection target) by one (1) (S11). Then, the monitoring unit 22 determines whether or not the BER of the chip 1 of the inspection target has exceeded a predetermined threshold value (S12). For example, the monitoring unit 22 employs a value obtained by dividing the error count value by the round value as the BER. When it is determined that the BER of the chip 1 of the inspection target has not exceeded the predetermined threshold value (No in S12), the monitoring unit 22 executes the process of step S2 again.

When it is determined that the BER of the chip 1 of the inspection target has exceeded the predetermined threshold value (Yes in S12), the monitoring unit 22 edits the index information 411 included in the used parameter management information 41 for the chip 1 of the inspection target, and associates the index 1 with a parameter set (hereinafter, referred to as a "new parameter set") for an operation in the potential distribution in which Vt is narrower (S13). For example, the index 1 associated with #1 is changed to #2. Here, a parameter set associated before a new parameter set is associated is referred to as an "old parameter set." In the state before the process of step S13 is executed, the index 0 and the index 1 remain associated with the same parameter set. As the process of step S13 is executed, the index 0 and the index 1 are associated with different parameter sets, respectively. In other words, through the process of step S13, the chip 1 of the inspection target transitions to the middle-of-Vt-change state.

Then, the monitoring unit 22 sets the write parameter included in the new parameter set to the parameter memory 11 including the chip 1 of the inspection target (S14), and executes the process of step S2 again. Through the process of step S14, when erasing and programming are executed on the chip 1 of the inspection target, the write parameter related to the new parameter set set to the parameter memory 11 is used.

Figure 13:
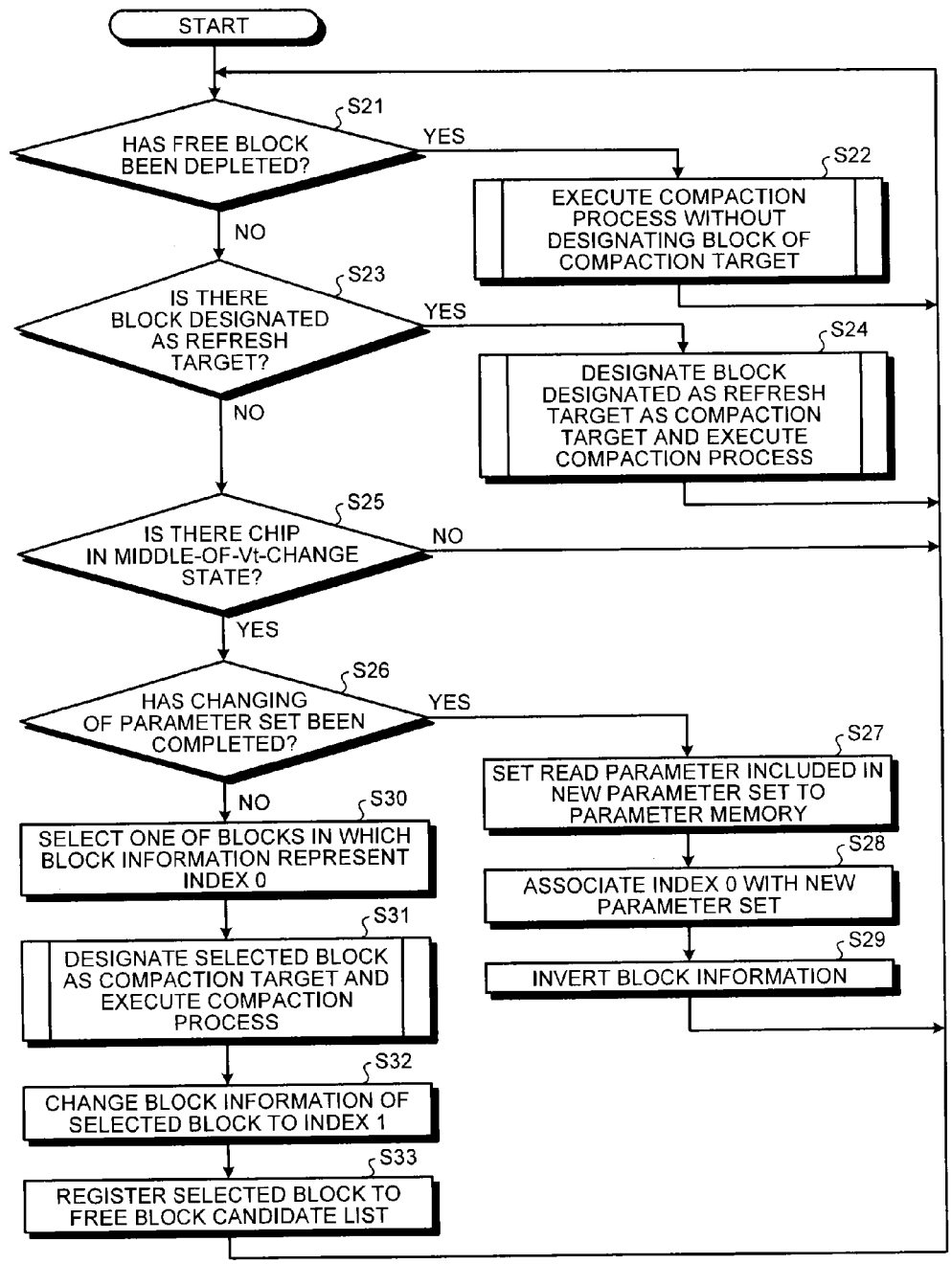
FIG. 13 is a flowchart for describing an operation of a compaction unit.
Figure 14:
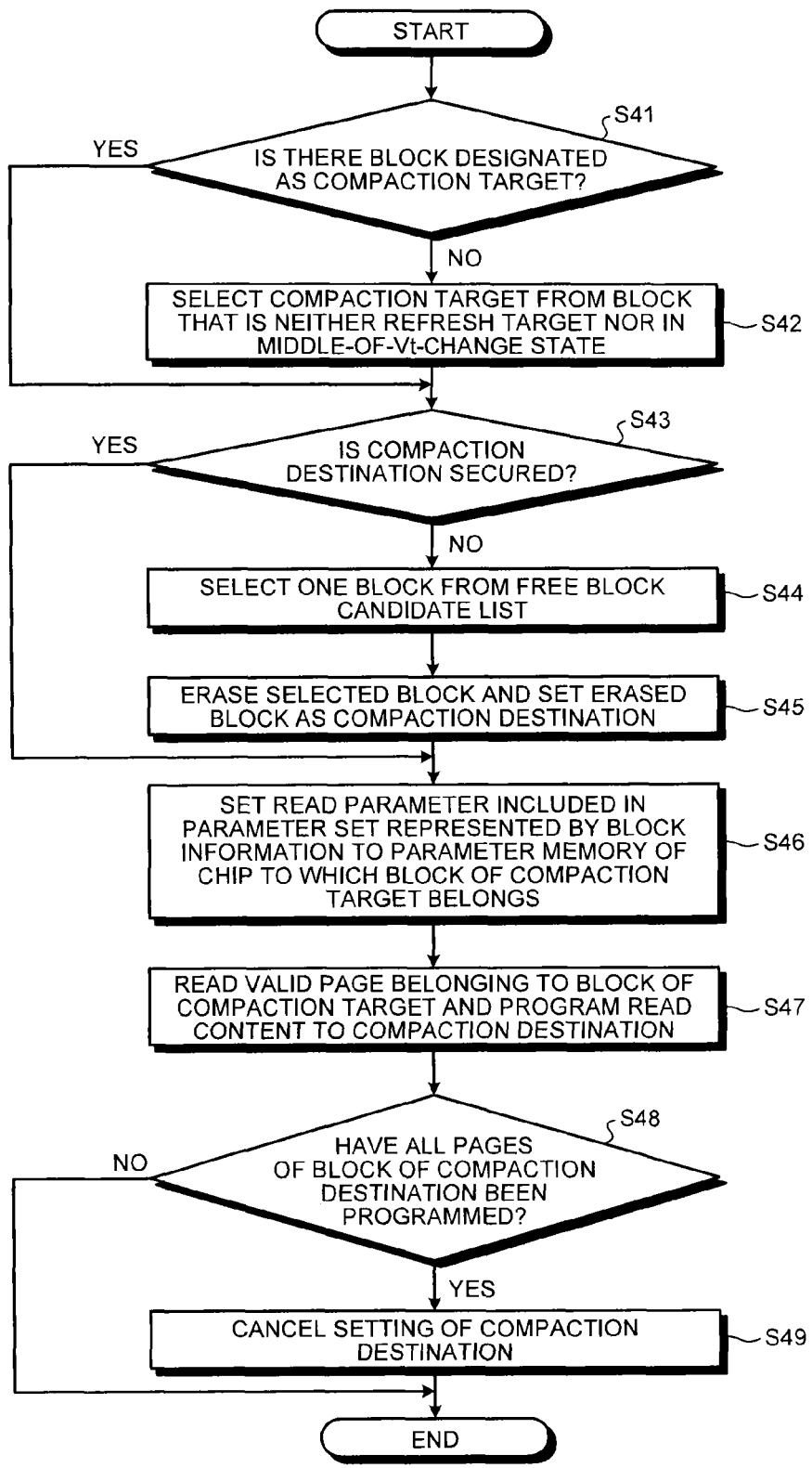
FIG. 14 is a flowchart for describing a compaction process.

FIG. 13 is a flowchart for describing an operation of the compaction unit 23. FIG. 14 is a flowchart for describing a compaction process by the compaction unit 23.

As illustrated in FIG. 13, the compaction unit 23 determines whether or not a free block has been depleted (S21). When it is determined that a free block has been depleted (Yes in S21), the compaction unit 23 executes the compaction process without designating a block of the compaction target (S22).

When it is determined that a free block has not depleted (No in S21), the compaction unit 23 determines whether or not there is a block designated as the refresh target by the monitoring unit 22 (S23). When it is determined that there is a block designated as the refresh target (Yes in S23), the compaction unit 23 designates the block designated as the refresh target as the compaction target, and executes the compaction process (S24).

When it is determined that there is no block designated as the refresh target (No in S23), the compaction unit 23 determines whether or not there is a chip 1 in the middle-of-Vt-change state (S25). When the index 0 and the index 1 in the index information 411 included in the used parameter management information 41 are associated with different parameter sets, respectively, the compaction unit 23 can recognize that the chip 1 corresponding to the used parameter management information 41 is in the middle-of-Vt-change state.

When it is determined that there is a chip 1 in the middle-of-Vt-change state (Yes in S25), the compaction unit 23 determines whether or not changing of the parameter set has been completed on all blocks belonging to the corresponding chip 1 (S26). Further, when there is a plurality of chips 1 in the middle-of-Vt-change state, the process of step S26 and subsequent steps are independently executed for each of the chips in the middle-of-Vt-change state. When the pieces of the block information 412 related to all blocks represent the new parameter set, the compaction unit 23 can determine that the changing of the parameter set has been completed on all blocks. Further, when there is the block information 412 representing the old parameter set, the compaction unit 23 can determine that there is a block on which the changing of the parameter set has not been completed.

When it is determined that the changing of the parameter set has been completed on all blocks (Yes in S26), the compaction unit 23 sets the read parameter included in the new parameter set to the parameter memory 11 of the chip 1 (S27). Then, the compaction unit 23 edits the index information 411 included in the used parameter management information 41 related to the chip 1, and associates the index 0 with the new parameter set (S28). Further, by performing bit inversion on all pieces of the block information 412 included in the used parameter management information 41 related to the chip 1, the compaction unit 23 unifies a value representing the index 0 (S29). Through the process of step S29, the middle-of-Vt-change state transitions to the Vt-change-completion state.

When it is determined that there is a block on which the changing of the parameter set has not been completed (No in S26), the compaction unit 23 selects a block representing the index 0, that is, the old parameter set with reference to the block information 412 (S30). Then, the compaction unit 23 designates the block selected by the process of step S30 as the compaction target, and executes the compaction process (S31). Then, the compaction unit 23 changes the block information 412 of the block selected by the process of step S30 to the value representing the index 1 (step S32), and registers the block to the free block candidate list 43 (S33).

The compaction unit 23 executes the process of step S21 again after the process of step S22, step S24, step S29, or step S33.

When the compaction process starts, first of all, the compaction unit 23 determines whether or not there is a block designated as the compaction target as illustrated in FIG. 14 (S41). When it is determined that there is no block is designated as the compaction target (No in S41), the compaction unit 23 selects the compaction target from a block that is neither the refresh target nor the one in the middle-of-Vt-change state (S42). In other words, this is an original compaction, and generally, a block having the smallest number of pages with effective data is selected, and a free block is generated as efficiently as possible. When it is determined that there is a block designated as the compaction target (S41, Yes), the compaction unit 23 skips the process of step S42.

Next, the compaction unit 23 determines whether or not a block (a compaction destination) programmed by a compaction is secured (S43). When it is determined that the compaction destination is not secured (No in S43), the compaction unit 23 selects one block from the free block candidate list 43 (S44), erases the selected block, and sets the erased block as the compaction destination (S45). The erase process of step S45 is executed using the write parameter set to the parameter memory 11. When it is determined that the compaction destination is secured (Yes in S43), the compaction unit 23 skips the process of steps S44 and S45.

Thereafter, the compaction unit 23 sets the read parameter included in the parameter set represented by the block information 412 of the block of the compaction target to the parameter memory 11 of the chip 1 to which the block of the compaction target belongs (S46). Then, the compaction unit 23 reads an effective page belonging to the block of the compaction target, and programs content of the effective page to the compaction destination (S47).

Next, the compaction unit 23 determines whether or not all pages of the block of the compaction destination have been programmed (S48). When it is determined that all pages have been programmed (Yes in S48), the compaction unit 23 cancels the setting of the compaction destination (S49), and ends the compaction process. When it is determined that the block of the compaction destination has a non-programmed page (No in S48), the compaction unit 23 skips the process of step S49.

Next, transition of the used parameter management information 41 will be described with reference to FIGS. 15 to 18. Here, the description will proceed with the transmission of the used parameter management information 41 related to one chip 1 under the assumption that the state illustrated in FIG. 10 is an initial state.

In a state directly after shipping, as illustrated in FIG. 10, in the index information 411, both the index 0 and the index 1 are associated with the parameter set #0 that makes possible an operation in the state in which Vt is the narrowest among the three parameter sets. Further, all pieces of the block information 412 indicate the index 0.

Figure 15:
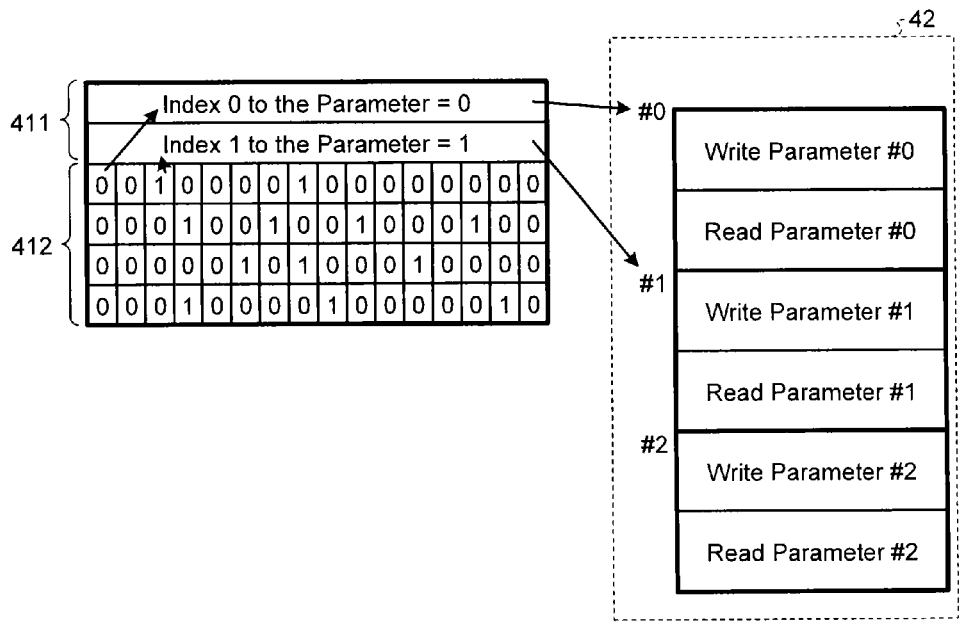
FIG. 15 is a diagram for describing transition of used parameter management information.
Figure 16:
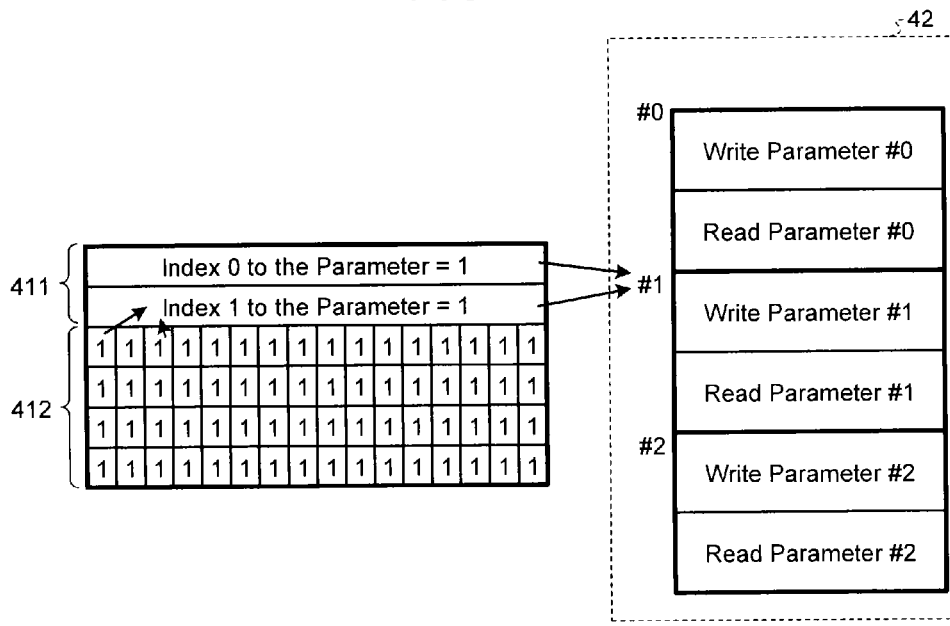
FIG. 16 is a diagram for describing transition of used parameter management information.

When the BER of the chip 1 exceeds a predetermined threshold value, through the process of step S13, the index 1 is associated with the parameter set #1, and the chip 1 becomes the middle-of-Vt-change state. FIG. 15 illustrates the used parameter management information 41 in a state in which Vt is being changed from the parameter set #0 to the parameter set #1. In this state, through the process of step S31, a block programmed using an old write parameter is erased using a new write parameter, and the block information 412 corresponding to the block is changed to the value representing the index 1. When programming is executed, the access unit 21 may issue a program command without changing the parameter set. When reading is executed, the access unit 21 compares the block information 412 of the read destination with the read parameter set to the parameter memory 11, and when both are different, the access unit 21 sets the read parameter included in the parameter set represented by the block information 412 of the read destination to the parameter memory 11 and then issues a read command.

When all blocks have been erased after the middle-of-Vt-change state, all pieces of the block information 412 represent the index 1. In this case, through the process of step S28, the index 0 is associated with the parameter set #1, and the used parameter management information 41 becomes a state illustrated in FIG. 16. Thereafter, through the process of step S29, the value of the block information 412 is changed so that all pieces of the block information 412 represent the index 0.

Figure 17:
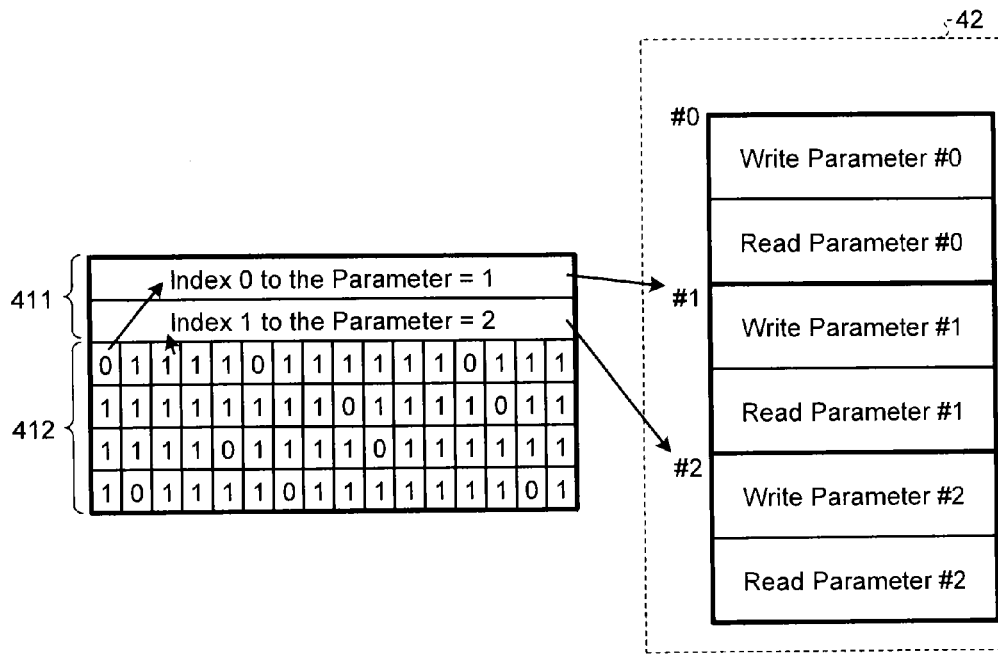
FIG. 17 is a diagram for describing transition of used parameter management information.
Figure 18:
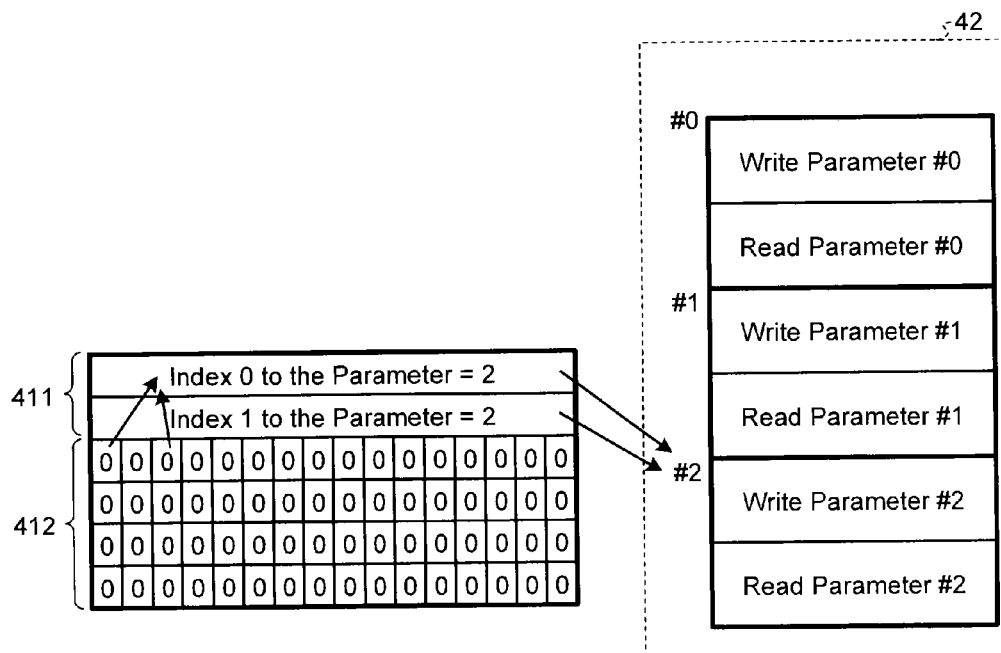
FIG. 18 is a diagram for describing transition of used parameter management information.

Then, when the BER of the chip 1 exceeds a predetermined threshold value again, through the process of step S13, the index 1 is associated with the parameter set #2, and the chip 1 becomes the middle-of-Vt-change state again. FIG. 17 illustrates the used parameter management information 41 in a state in which Vt is being changed from the parameter set #1 to the parameter set #2.

Then, when all blocks have been erased after the middle-of-Vt-change state, all pieces of the block information 412 represent the index 1. In this case, the index 0 is associated with the parameter set #2 through the process of step S28, the value of the block information 412 is changed so that all pieces of the block information 412 represent the index 0 through the process of step S29, and thus the used parameter management information 41 becomes a state illustrated in FIG. 18.

Figure 19:
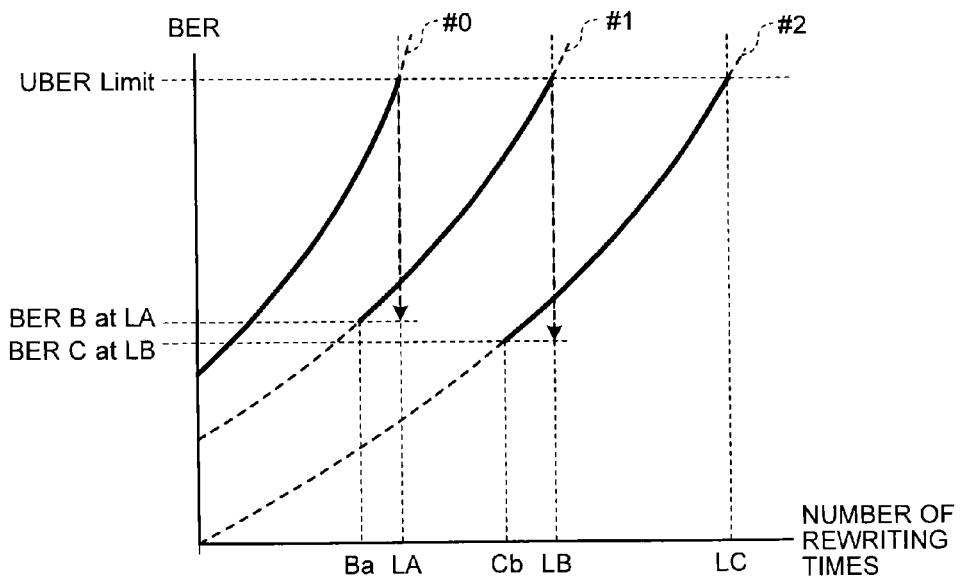
FIG. 19 is a diagram illustrating an effect of the first embodiment.
Figure 20:
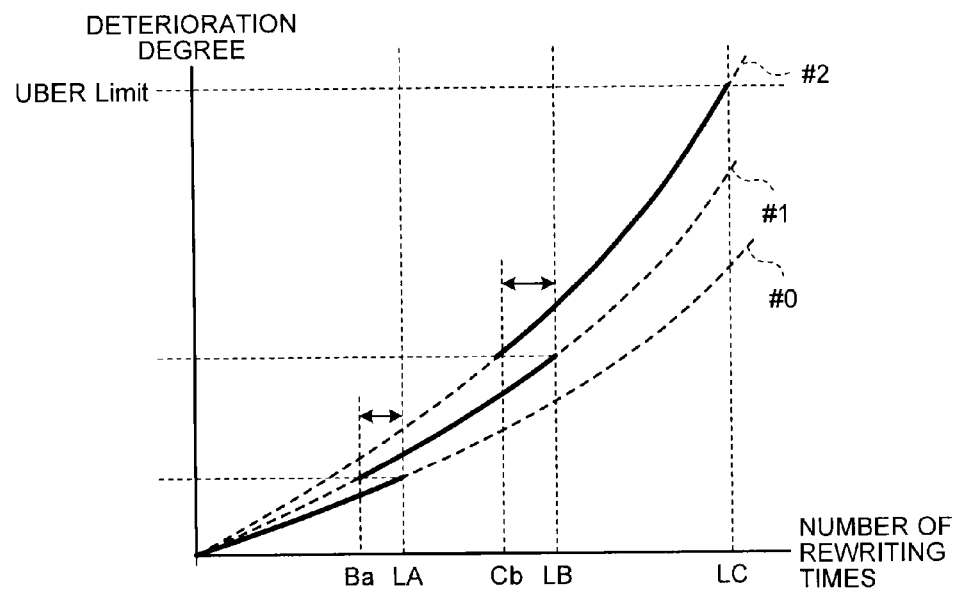
FIG. 20 is a diagram illustrating an effect of the first embodiment.

FIGS. 19 and 20 are diagrams illustrating an effect of the first embodiment of the present invention.

FIG. 19 is a diagram illustrating a relation between the number of rewriting times and the BER. A horizontal axis represents the number of rewriting times (logarithmic expression), and a vertical axis represents the BER (logarithmic expression). In FIG. 19, a curve #0 represents transition of the BER when an operation is performed using the parameter set #0, a curve #1 represents transition of the BER when an operation is performed using the parameter set #1, and a curve #2 represents transition of the BER when an operation is performed using the parameter set #2.

When an operation is performed using the respective parameter sets, the USER needs to be converged to be constantly a predetermined threshold value (a USER limit) or less. Thus, when an operation is performed using the parameter set #0, the user limit is reached when the number of rewriting times becomes LA. When an operation is performed using the parameter set #1, the user limit is reached when the number of rewriting times becomes LB. When an operation is performed using the parameter set #2, the user limit is reached when the number of rewriting times becomes LC.

When the number of rewriting times LA of the use limit is reached using the parameter set #0, if the parameter set #1 is applied in this state, the margin between the potential distributions increases, and thus the BER is lowered up to a point of BER B at LA. Similarly, when the number of rewriting times LB of the use limit is reached using the parameter set #1, if the parameter set #2 is applied in this state, the margin between the potential distributions increases, and thus the BER is lowered up to a point of BER C at LB.

At BRE B at LA, the number of rewriting times Ba of the curve #1 does not match La. It is because deterioration degree of a film by single rewriting when an operation is performed using the parameter set #0 differs from that when an operation is performed using the parameter set #1. A state of deterioration of a film when the number of rewriting times LA of the user limit is reached using the parameter set #0 is equal to a state of deterioration at a point in time when the number of rewriting times becomes Ba by an operation using the parameter set #0. The parameter set #0 is smaller in Vt than the parameter set #1. Thus, when an operation is performed using the parameter set #0, a deterioration speed of a film is slower than that when an operation is performed using the parameter set #1. Thus, a value of Ba is smaller than a value of La. Due to the same reason, at BRE C at LB, the number of rewriting times Cb of the curve #2 is smaller than LB.

FIG. 20 is a diagram illustrating a relation between the number of rewriting times and a deterioration degree. A horizontal axis represents the number of rewriting times (logarithmic expression), and a vertical axis represents a deterioration degree of a film. In FIG. 20, a curve #0 represents transition of a deterioration degree when an operation is performed using the parameter set #0, a curve #1 represents transition of a deterioration degree when an operation is performed using the parameter set #1, and a curve #2 represents transition of a deterioration degree when an operation is performed using the parameter set #2. Since the deterioration speed increases as the value of Vt increases, a gradient is getting larger in the order of the curve #0, the curve #1, and the curve #2. Further, since an operation is performed while switching the parameter set in the order of the parameter set #0, the parameter set #1, and the parameter set #2, compared to when an operation is performed using the parameter set #2 from the beginning, the number of rewriting times (that is, the number of rewritable times) until the use limit is reached increases by (LB−Cb)+(LA−Ba).

The above description has been made under the assumption that the parameter set of one set is set to the parameter memory 11. Parameter sets of two or more sets may be set to the parameter memory 11, and the memory chip 1 may be configured to switch the read parameter according to an instruction from the CPU 2. Thus, the CPU 2 does not need to perform an operation of transferring the read parameter to the memory chip 1 each time the read parameter used for reading changes, and thus the reading performance is improved.

Further, for example, the parameter set information 42 is prepared by a vendor of the memory chip 1. For example, the parameter set information 42 is recorded in the memory cell array 10, a read only memory (ROM) (not illustrated) in the memory chip 1, or a FUSE (not illustrated) in the memory chip 1 in advance. Further, when the SSD 100 is activated, the parameter set information 42 is read from a recording destination and developed in the RAM 4. The parameter set information 42 may be configured not to be developed in the RAM 4. For example, when a command designating one parameter set is input, the memory chip 1 reads the designated parameter set among the parameter sets recorded in the parameter set information 42 recorded in the own memory chip 1, and sets the read parameter to the parameter memory 11 of the own memory chip 1.

Further, the used parameter management information 41, the parameter set information 42, and the free block candidate list 43 which are developed in the RAM 4 are made non-volatile when power is turned off. The used parameter management information 41, the parameter set information 42, and the free block candidate list 43 may be programmed to the memory cell array 10 so as not to be made non-volatile. Further, the memory controller may include a non-volatile memory, and may store the used parameter management information 41, the parameter set information 42, and the free block candidate list 43 in the non-volatile memory.

Further, the write parameter and the read parameter are individually set to the parameter memory 11. The write parameter is changed in units of chips, and the read parameter is changed depending on a block of a read destination. Thus, an overhead according to switching of a parameter can be reduced to be as small as possible. The write parameter and the read parameter may be simultaneously set in units of parameter sets. Alternatively, the write parameter may not be changed in units of chips. In other words, for example, the write parameter and the read parameter may be changed in units of parameter sets and according to a block of an access destination.

Further, the block information 412 may be configured to have an information amount of 1 bit for each block and represent one of two parameter sets. The block information 412 of each block may be configured to have an information amount of two or more bits and represent one of three or more parameter sets. For example, when the accuracy of wear leveling is not high and so a variation in the number of rewriting times of each block is large, the block information 412 of each block may be configured to have an information amount of two or more bits.

Further, the number of prepared parameter sets is not limited to three.

Further, a technique of holding setting content of the parameter memory 11 when power is turned off is arbitrary. For example, when the memory chip 1 transitions to a power off state, the memory chip 1 may cause setting content of the parameter memory 11 to be saved in the memory cell array 10, and when the memory chip 1 transitions to a power on state, the memory chip 1 may cause setting content of the parameter memory 11 saved in the memory cell array 10 to be set to the parameter memory 11.

Further, the SSD 100 has the two ECC circuits (the ECC circuit 51 and the ECC circuit 6), and executes a two-step error correction. The SSD 100 may be configured to execute a three-step error correction or may be configured to execute a one-step error correction. Further, the SSD 100 may be configured such that the CPU 2 executes error correction based on software. Alternatively, the ECC circuit may be mounted in the memory chip 1 rather than the memory controller.

As described above, according to the first embodiment of the present invention, the CPU 2 changes the write parameter so that an interval of a threshold voltage between different pieces of data increases with the progress of deterioration of a memory cell. In other words, a memory controller according to an embodiment causes the memory chip 1 to perform a program operation in a first mode, and when a predetermined condition is satisfied, performs switching from the first mode to a second mode and causes the memory chip 1 to perform a program operation in the second mode. Further, a difference between a maximum value and a minimum value of a threshold value set to the memory cell 1 by the program operation in the second mode is larger than a difference between a maximum value and a minimum value of a threshold value set to the memory cell 1 by the program operation in the first mode. Further, according to the first embodiment, the predetermined condition is a condition that an error bit rate exceeds a predetermined threshold value. Thus, when a deterioration degree of a film is low, a deterioration speed of a film is reduced to be slower than in the comparative example, and thus the number of rewriting times of the SSD 100 can be increased.

Further, the SSD 100 includes the ECC circuit 51 and the ECC circuit 6. Thus, even when deterioration of a film progresses and an error occurs according to a variation in a threshold voltage, an operation can be performed to perform reading or writing from or to the memory chip 1 while reducing a deterioration speed of a film.

Further, the CPU 2 monitors the error occurrence rate, and changes the write parameter at a timing at which the error occurrence rate exceeds the determination threshold value previously decided according to the correction capability by the ECC circuit 51 and the ECC circuit 6. Thus, a deterioration speed of a film can be reduced to be as small as possible.

Further, the initial value of the write parameter may be a value previously set so that an interval between the potential distributions is an interval causing an error. It is because even when an operation is performed using the initial value of the write parameter and so an error occurs, the error is corrected by exertion of the correction capability of the ECC circuit 51 and the ECC circuit 6.

(Second Embodiment)

In an embodiment of the present invention, the parameter set is changed so that Vt extends with the progress of deterioration of a film. For example, in the first embodiment, a switching timing of a parameter set is decided based on a report from the ECC. A progress degree of deterioration of a film is calculated, and a switching timing of a parameter set may be decided based on a calculation value representing a deterioration degree.

According to a second embodiment, the monitoring unit 22 monitors a wear level instead of a BER. The wear level is a measure representing a deterioration degree. The wear level will be described below.

The wear level is a real number that increases depending on the number of rewriting times. The wear level is obtained such that a wear amount of each cycle (E/P) including erasing and programming is integrated. The wear amount of each E/P is a value obtained by executing correction according to a use temperature and correction according to an in-use parameter set on a reference wear amount under the assumption that a wear amount (the reference wear amount) is 1.0 when single E/P is performed using a write parameter (a reference parameter set) having the largest Vt at a reference temperature. The correction is implemented by multiplying the reference wear amount by a correction coefficient.

For example, the correction coefficient is calculated in advance as follows. First of all, the curves #0 to #2 illustrated in FIG. 19 are calculated by an experiment or a calculation. The correction coefficient of the parameter set #0 based on the parameter set #1 is calculated by a calculation of $Ba/LA$. Further, the correction coefficient of the parameter set #1 based on the parameter set #2 is calculated by a calculation of $(Cb-Ba)/(LB-LA)$. Thus, when the parameter #2 is used as the reference parameter set, the correction coefficient of the parameter set #0 is calculated by a calculation of $Ba*(Cb-Ba)/LA/(LB-LA)$. The correction coefficients of the parameter set #0 and the parameter set #1 are calculated for each operation temperature while changing an operation temperature with a predetermined step size.

The monitoring unit 22 stores the correction coefficient for each operation temperature and for each parameter set in advance. Further, each time E/P is executed, the monitoring unit 22 selects the correction coefficient based on the operation temperature and the write parameter used for E/P, and calculates the wear amount based on the selected correction coefficient. The write parameter used for E/P is acquired with reference to the parameter set associated with the index 1 in the index information 411 included in the used parameter management information 41. The monitoring unit 22 integrates the calculated wear amount in units of chips, and obtains a wear level of each chip. For example, the wear level of each chip is configured to be recorded in the used parameter management information 41.

Alternatively, the monitoring unit 22 may calculate a wear level for each block and employ a maximum value among wear levels of blocks included in the chip 1 as a wear level of the chip 1.

The wear level in the use limit is referred to as a maximum wear level. The switching of the parameter set is executed according to the wear level. For example, the monitoring unit 22 executes the process of step S13 on the index information 411 related to the chip 1 at a timing at which the wear level of the chip 1 reaches a predetermined percentage of the maximum wear level. For example, when the wear level reaches 45% of the maximum wear level, the monitoring unit 22 changes the parameter set from the parameter set #0 to the parameter set #1. Further, when the wear level reaches 80% of the maximum wear level, the monitoring unit 22 changes the parameter set from the parameter set #1 to the parameter set #2. A threshold value used to determine a switching timing may be arbitrarily set.

As described above, according to the second embodiment of the present invention, the CPU 2 monitors the number of rewriting times on a memory cell. Then, the CPU 2 calculates a wear level from the number of rewriting times, and changes a write parameter at a timing at which the wear level exceeds a predetermined threshold value. A technique of calculating a wear level is not limited to the above example. The CPU 2 may count at least one of the number of erasing times, the number of reading times, and the number of writing times, and may calculate a wear level based on the number counted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory; and
a memory controller that controls the non-volatile memory, wherein
the non-volatile memory comprises:
a memory cell array that includes a plurality of memory cells which are configured to be settable with a plurality of different threshold voltages and to store data corresponding to the threshold voltages set thereto, each of the plurality of the different threshold voltages of the memory cells forming each of a plurality of different distributions, and an access control unit that performs a program operation for programing data to the memory cells and a read operation for reading data from the memory cells, wherein the memory controller comprises:

a read/write control unit that causes the access control unit to perform a program operation based on a first program parameter set, performs switching from the first program parameter set to a second program parameter set when the memory system starts to be used, and when a predetermined condition is satisfied, and causes the access control unit to perform a program operation based on the second program parameter set, a difference between a threshold voltage of a highest distribution and a threshold voltage of a lowest distribution set to the memory cells by the program operation based on the second program parameter set is larger than a difference between a threshold voltage of a highest distribution and a threshold voltage of a lowest distribution set to the memory cells by the program operation based on the first program parameter set, wherein the read/write control unit causes the access control unit to perform a read operation based on a first read parameter set when the read/write control unit causes the access control unit to perform the program operation based on the first program parameter set, and causes the access control unit to perform a read operation based on a second read parameter set when the read/write control unit causes the access control unit to perform the program operation based on the second program parameter set, the first read parameter set corresponding to the first program parameter set, and the second read parameter set corresponding to the second program parameter set.

2. The memory system according to claim 1, wherein the memory controller further includes an error correcting unit which performs an error correction process on data read from the non-volatile memory, and the read/write control unit performs the switching when an error bit rate of data read from the non-volatile memory exceeds a predetermined threshold value.

3. The memory system according to claim 1, wherein the read/write control unit performs the switching in units of blocks of the non-volatile memory, a block being an erase unit of the non-volatile memory.

4. The memory system according to claim 3, wherein the read/write control unit sequentially performs an error correction process on data stored in a plurality of blocks included in the non-volatile memory, and performs switching for a block which storing data of which error bit rate exceeds a predetermined threshold value.

5. The memory system according to claim 1, wherein the memory controller further includes a count unit that counts at least one of the number of erase operation times, the number of read operation times, and the number of program operation times of the memory cell, and the read/write control unit performs the switching with reference to at least one of the number of erasing times, the number of reading times, and the number of writing times.

6. The memory system according to claim 5, wherein the read/write control unit performs the switching by sequentially reference to the number of erasing times of a plurality of blocks included in the non-volatile memory, and performs the switching.

7. A memory system comprising:
a non-volatile memory; and
a memory controller that controls the non-volatile memory, wherein the non-volatile memory comprises:
a memory cell array that includes a plurality of memory cells which are configured to be settable with a plurality of different threshold voltages and to store data corresponding to the threshold voltages set thereto, each of the plurality of the different threshold voltages of the memory cells forming each of a plurality of different distributions, and an access control unit that performs a program operation for programing data to the memory cells and a read operation for reading data from the memory cells, wherein the memory controller causes the access control unit to perform a program operation in a first mode when the memory system starts to be used, and when a predetermined condition is satisfied, performs switching from the first mode to a second mode and causes the access control unit to perform a program operation in the second mode, a difference between a threshold voltage of a highest distribution and a threshold voltage of a lowest distribution set to the memory cell by the program operation in the second mode is larger than a difference between a threshold voltage of a highest distribution and a threshold voltage of a lowest distribution set to the memory cell by the program operation in the first mode, and the memory controller causes the access control unit to perform a read operation in a third mode when the memory controller causes the access control unit to perform the program operation in the first mode, and causes the access control unit to perform a read operation in a fourth mode when the memory controller causes the access control unit to perform the program operation in the second mode, the third mode corresponding to the first mode, and the fourth mode corresponding to the second mode.

8. The system according to claim 7, wherein the memory controller further includes an error correcting unit which performs an error correction process on data read from the non-volatile memory, and the read/write control unit performs the switching when an error bit rate of data read from the non-volatile memory exceeds a predetermined threshold value.

9. The system according to claim 7, wherein the memory controller further includes a count unit that counts at least one of the number of erase operation times, the number of read operation times, and the number of program operation times of the memory cell, and the read/write control unit performs the switching with reference to at least one of the number of erasing times, the number of reading times, and the number of writing times.

10. A memory system comprising:
a non-volatile memory; and
a memory controller that controls the non-volatile memory, wherein the non-volatile memory comprises:
- a memory cell array that includes a plurality of memory cells which are configured to be settable with a plurality of different threshold voltages and to store data corresponding to the threshold voltages set thereto, each of the plurality of the different threshold voltages of the memory cells forming each of a plurality of different distributions, and
- an access control unit that performs a program operation for programing data to the memory cells and a read operation for reading data from the memory cells, wherein the memory controller comprises:
- a read/write control unit that causes the access control unit to perform a program operation based on a first program parameter set when the memory system starts to be used, controls changing the first program parameter set to a second program parameter set when a predetermined time elapses, and causes the access control unit to perform a program operation based on the second program parameter set, a difference between a threshold voltage of a highest distribution and a threshold voltage of a lowest distribution set to the memory cells by the program operation based on the second program parameter set being larger than a difference between a threshold voltage of a highest distribution and a threshold voltage of a lowest distribution set to the memory cells by the program operation based on the first program parameter set, and wherein the read/write control unit causes the access control unit to perform a read operation based on a first read parameter set when the read/write control unit causes the access control unit to perform the program operation based on the first program parameter set, and causes the access control unit to perform a read operation based on a second read parameter set when the read/write control unit causes the access control unit to perform the program operation based on the second program parameter set, the first read parameter set corresponding to the first program parameter set, and the second read parameter set corresponding to the second program parameter set.

11. The memory system according to claim 10, wherein the read/write control unit controls the changing in units of blocks of the non-volatile memory, a block being an erase unit of the non-volatile memory.

* * * * *